(12) United States Patent
Horng et al.

(10) Patent No.: US 8,391,009 B2
(45) Date of Patent: Mar. 5, 2013

(54) HEAT DISSIPATING ASSEMBLY

(75) Inventors: Alex Horng, Kaohsiung (TW);
Chi-Hung Kuo, Kaohsiung (TW);
Chih-Hao Chung, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 208 days.

(21) Appl. No.: 12/895,952

(22) Filed: Oct. 1, 2010

(65) Prior Publication Data

US 2011/0310559 A1 Dec. 22, 2011

Related U.S. Application Data

(63) Continuation-in-part of application No. 12/818,211, filed on Jun. 18, 2010, now abandoned.

(51) Int. Cl.
*H05K 7/20* (2006.01)

(52) U.S. Cl. ........ 361/707; 361/695; 361/704; 362/294; 165/80.3

(58) Field of Classification Search .................. None
See application file for complete search history.

(56) References Cited

U.S. PATENT DOCUMENTS

| | | | |
|---|---|---|---|
| 6,428,189 B1 * | 8/2002 | Hochstein | 362/373 |
| 6,999,318 B2 * | 2/2006 | Newby | 361/719 |
| 7,054,159 B2 * | 5/2006 | Nakamura | 361/719 |
| 7,549,774 B2 | 6/2009 | Tsai | |
| 7,572,033 B2 * | 8/2009 | Sun et al. | 362/294 |
| 7,625,104 B2 | 12/2009 | Zhang et al. | |
| 7,682,048 B2 | 3/2010 | Hsu et al. | |
| 7,686,480 B2 * | 3/2010 | Chien et al. | 362/294 |
| 7,780,315 B2 * | 8/2010 | Gasquet et al. | 362/294 |
| 7,929,312 B2 * | 4/2011 | Tamura | 361/760 |
| 8,062,912 B2 * | 11/2011 | Wang et al. | 438/22 |
| 8,071,998 B2 * | 12/2011 | Chen | 257/99 |
| 2004/0136163 A1 * | 7/2004 | Horng et al. | 361/719 |
| 2006/0180821 A1 * | 8/2006 | Fan et al. | 257/98 |

FOREIGN PATENT DOCUMENTS

CN 1635824 A 7/2005

* cited by examiner

*Primary Examiner* — Boris Chervinsky
(74) *Attorney, Agent, or Firm* — Alan Kamrath; Kamrath IP Lawfirm, P.A.

(57) ABSTRACT

A heat dissipating assembly includes a circuit board having opposite first and second faces. The circuit board further includes a through-hole extending from the first face through the second face. A heat generating element is mounted on the first face of the circuit board and electrically coupled to the circuit board. The heat generating element includes a heat conducting portion aligned with the through-hole. A heat dissipating unit includes a base having an engaging face in contact with the second face of the circuit board. A heat conducting adhesive is filled in the through-hole. The heat conducting adhesive is engaged with the engaging face of the base and the heat conducting portion of the heat generating element. The heat generating element is directly engaged with the heat dissipating unit by the heat conducting adhesive to effectively enhance the overall heat dissipating efficiency while reducing the number of members to lower the manufacturing costs.

26 Claims, 11 Drawing Sheets

HEAT DISSIPATING ASSEMBLY

This is a continuation-in-part application of U.S. patent application Ser. No. 12/818,211 filed on Jun. 18, 2010 now abandoned.

BACKGROUND OF THE INVENTION

1. Field of the Invention

The present invention generally relates to a heat dissipating assembly and, more particularly, to a heat dissipating assembly that is simple in structure and that can be manufactured at low costs.

2. Description of the Related Art

FIGS. 1-3 show a conventional heat dissipating assembly 9 including a circuit board 91, a plurality of heat generating elements 92, a heat spreader plate 93, and a heat dissipating unit 94. A plurality of contacts 911 is provided on a side of the circuit board 91 and electrically connected to the heat generating elements 92. The heat spreader plate 93 includes first and second faces 931 and 932. The circuit board 91 is engaged with the first face 931 of the heat spreader plate 93 by heat pressing, adhering, or screwing. The heat spreader plate 93 is made of aluminum having excellent thermal conductivity and low specific gravity. The heat dissipating unit 94 is a metal heat sink and is firmly bonded to the second face 932 of the heat spreader plate 93 by a heat-conducting binding layer 95 of adhesive with excellent heat conductivity. The heat dissipating unit 94 includes a plurality of spaced fins 941 on a surface not engaged with the heat spreader plate 93.

With reference to FIGS. 2 and 3, the heat generated during operation of the heat generating elements 92 is transmitted to and absorbed by the heat spreader plate 93 via the circuit board 91. The heat is then transmitted to the heat dissipating unit 94. The fins 941 increase the heat dissipating area and thus enhances the heat dissipating efficiency, avoiding damage to or degraded performance of the heat generating elements 92 due to excessively high working temperature.

The heat conducting efficiency is poor, because the heat generated by the heat generating elements 92 must be transmitted through many members including the circuit board 91, the heat spreader plate 93, and the heat-conducting binding layer 95 made of different materials before heat exchange occurs at the fins 941 of the heat dissipating unit 94. The circuit board 91 made of insulating material further decreases the heat conducting efficiency. Furthermore, the heat dissipating assembly 9 has many members and thus has high manufacturing costs. Further, the heat spreader plate 93 and the heat dissipating unit 94 are both made of metal material and thus, require the heat-conducting binding layer 95 to provide reliable engagement therebetween. Further, the circuit board 91 must be engaged with the first face 931 of the heat spreader plate 93 by heat pressing, adhering, or screwing. All of these increase the complexity and difficulties in assembling the heat dissipating assembly 9. The production/assembling efficiency is thus low. Thus, a need exists for an improved heat dissipating assembly.

SUMMARY OF THE INVENTION

An objective of the present invention is to provide a heat dissipating assembly in which the heat generated by the heat generating elements is directly transmitted to the heat dissipating unit, enhancing the heat dissipating effect.

Another objective of the present invention is to provide a heat dissipating assembly with fewer members to enhance the assembling efficiency and to reduce the manufacturing costs.

The present invention fulfills the above objectives by providing, in a preferred form, a heat dissipating assembly which includes a circuit board having opposite first and second faces. The circuit board further includes a through-hole extending from the first face through the second face. A heat generating element is mounted on the first face of the circuit board and electrically coupled to the circuit board. The heat generating element includes a heat conducting portion aligned with the through-hole. A heat dissipating unit includes a base having an engaging face in contact with the second face of the circuit board. A heat conducting adhesive is filled in the through-hole. The heat conducting adhesive is engaged with the engaging face of the base and the heat conducting portion of the heat generating element.

The heat generating element is directly engaged with the heat dissipating unit by the heat conducting adhesive to effectively enhance the overall heat dissipating efficiency while reducing the number of members to lower the manufacturing costs.

In another preferred form, the heat dissipating assembly includes a plurality of through-holes each receiving a heat conducting adhesive.

The present invention will become clearer in light of the following detailed description of its illustrative embodiments described in connection with the drawings.

BRIEF DESCRIPTION OF THE DRAWINGS

The illustrative embodiments may best be described by referring to the accompanying drawings where.

Figure 1:
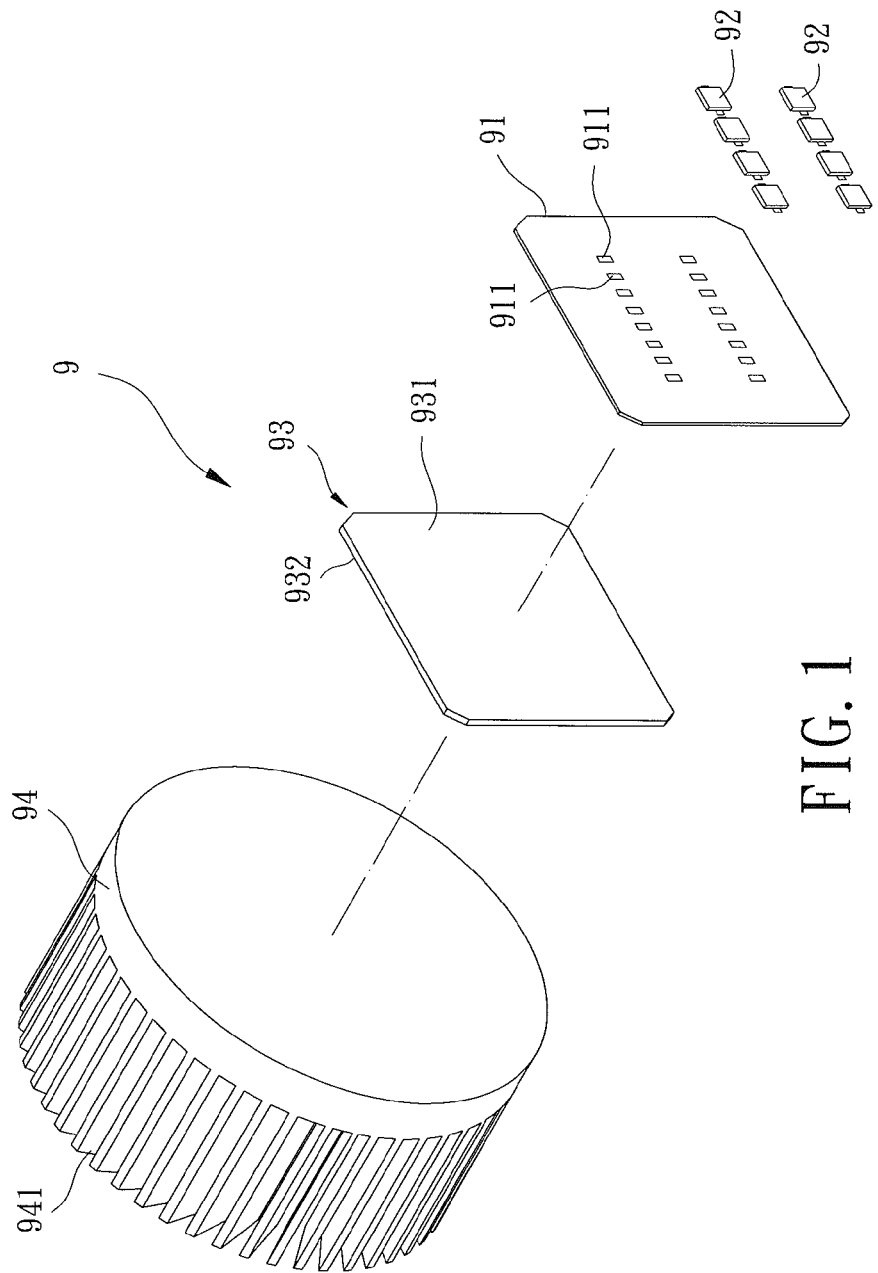
FIG. 1 shows an exploded, perspective view of a conventional heat dissipating assembly.
Figure 2:
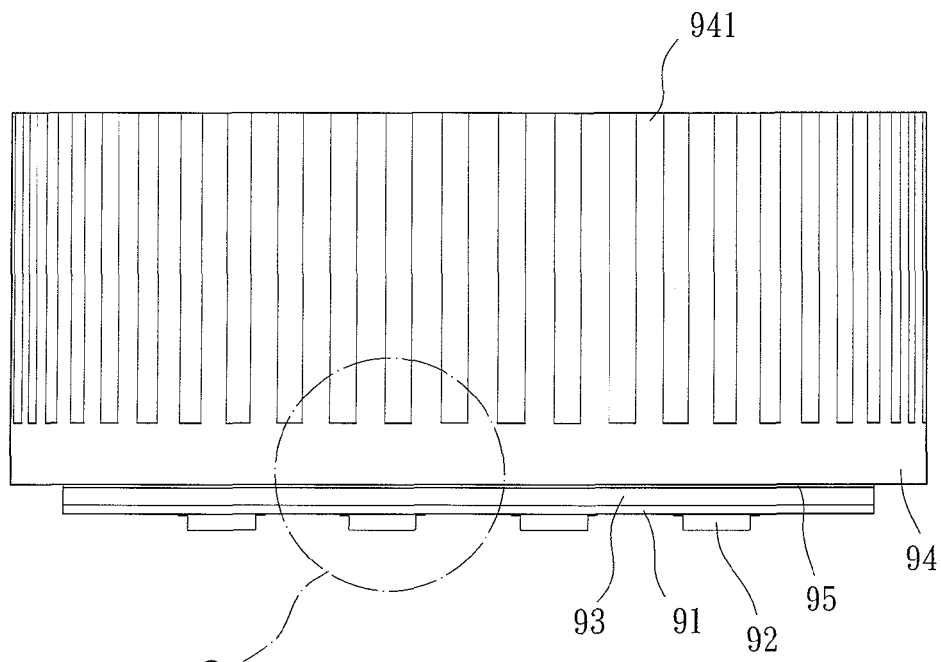
FIG. 2 shows a side view of the heat dissipating assembly of FIG. 1.
Figure 3:
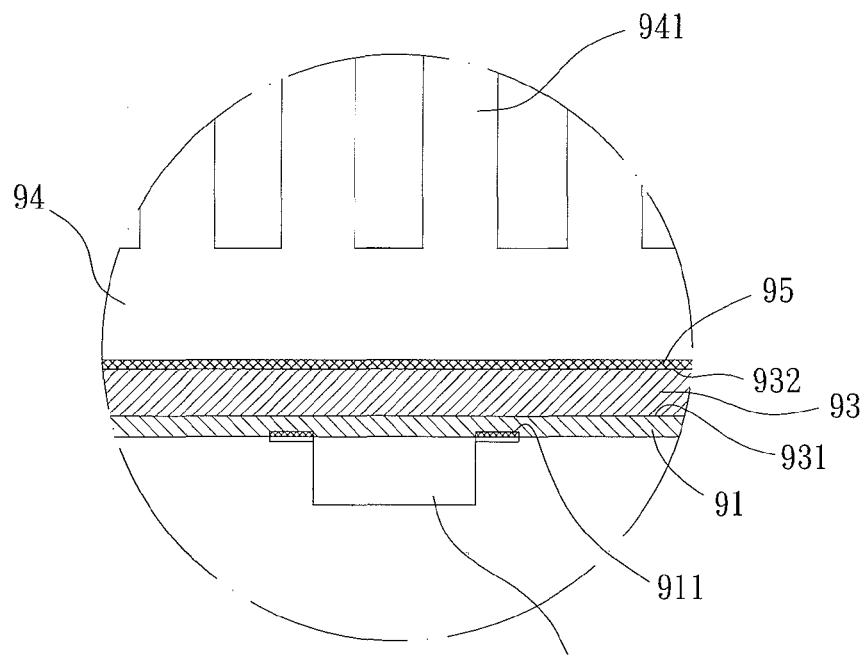
FIG. 3 shows an enlarged view of a circled portion of the heat dissipating assembly of FIG. 2.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions that conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "side", "face", and similar terms are used herein, it should be understood that these terms refer only to the structure shown in the drawings as it would appear to a person viewing the drawings and are utilized only to facilitate describing the invention.

DETAILED DESCRIPTION OF THE INVENTION

A heat dissipating assembly of a first embodiment according to the preferred teachings of the present invention is shown in FIGS. 4-7. The heat dissipating assembly is utilized with an LED lamp in the illustrated embodiment. However, the heat dissipating assembly can be utilized in other electronic devices requiring heat dissipation according to the teachings of the present invention.

Figure 4:
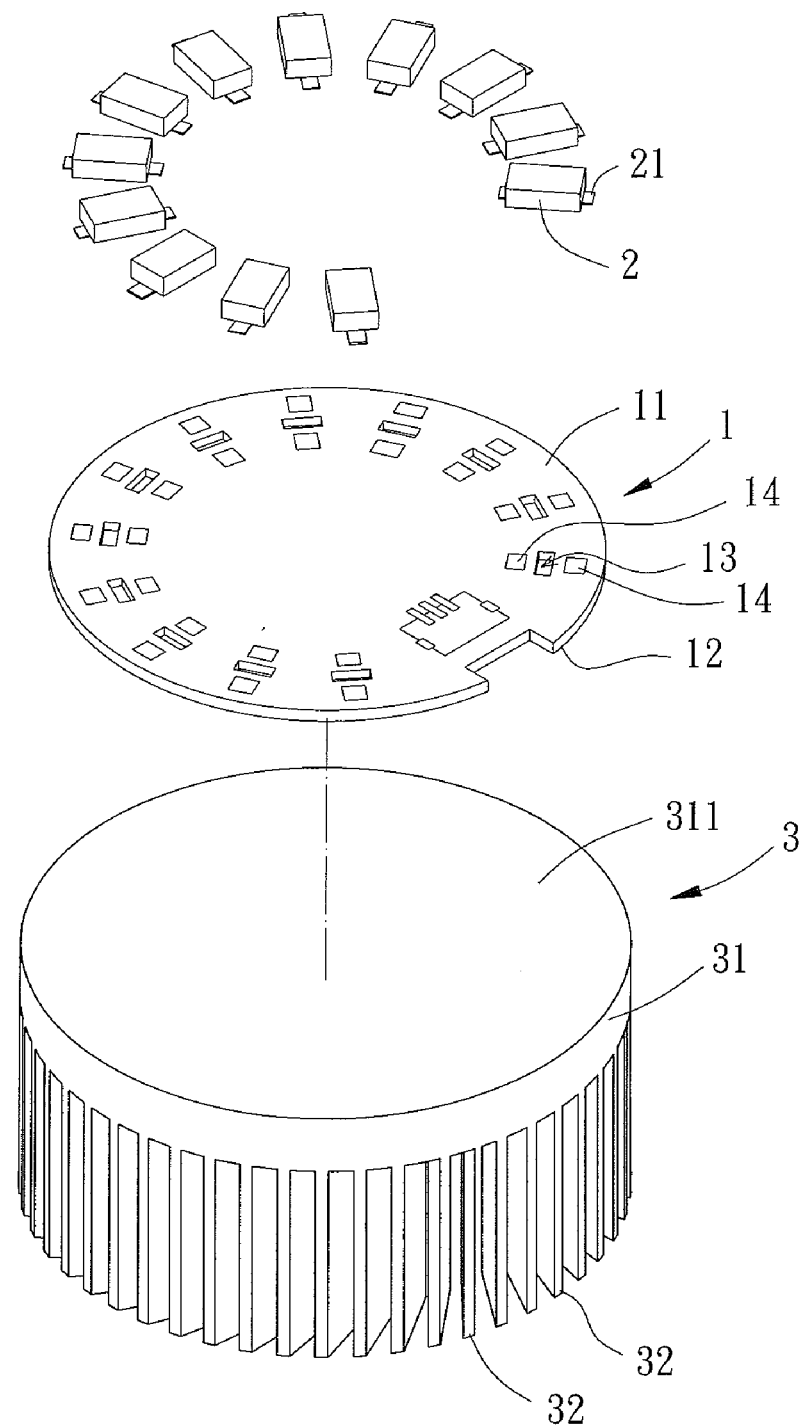
FIG. 4 shows an exploded, perspective view of a heat dissipating assembly of a first embodiment according to the preferred teachings of the present invention.
Figure 5:
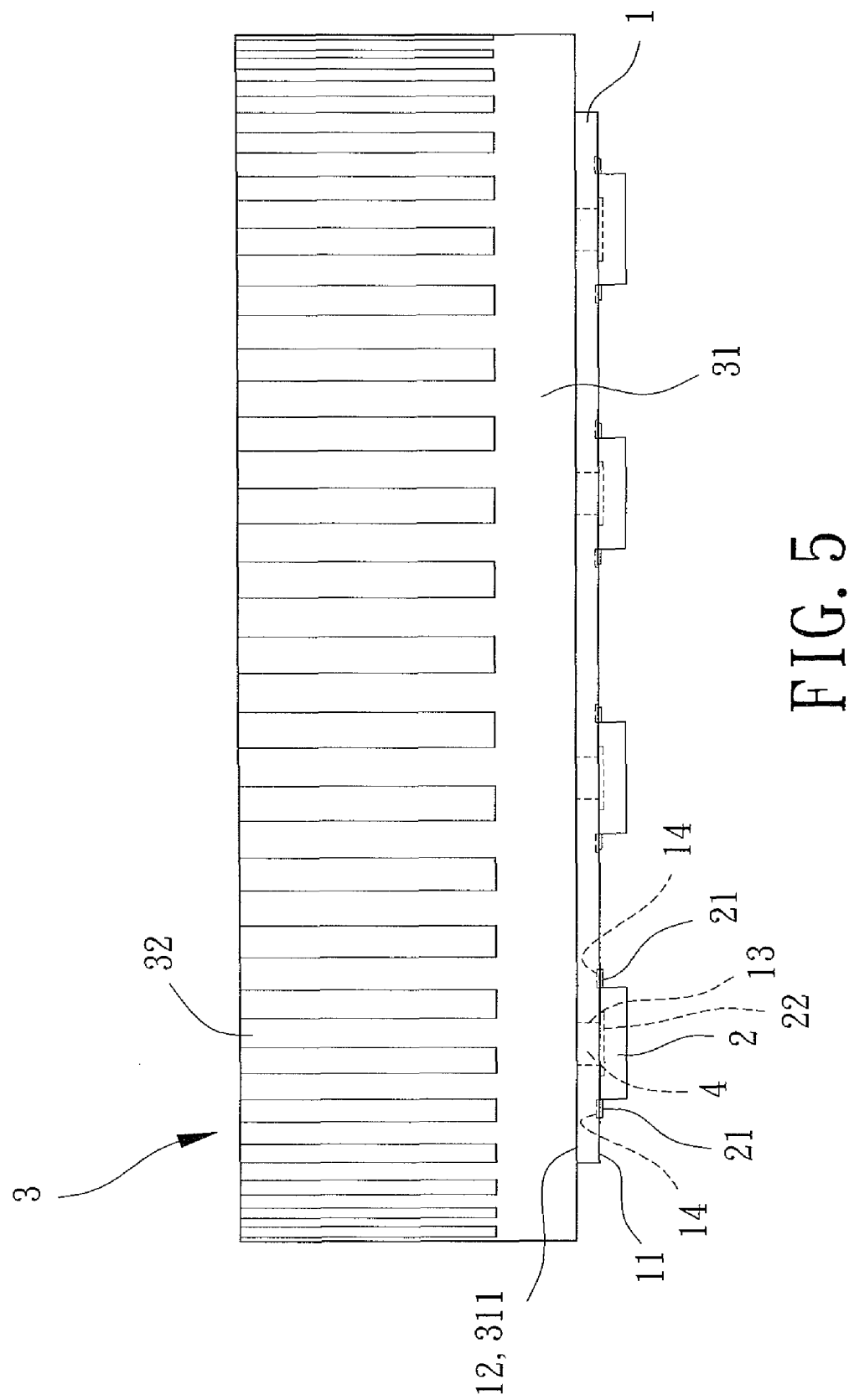
FIG. 5 shows a side view of the heat dissipating assembly of FIG. 4.

With reference to FIG. 4, the heat dissipating assembly of the first embodiment includes a circuit board 1, a plurality of heat generating elements 2, a heat dissipating unit 3, and heat conducting adhesive 4. The circuit board 1 is sandwiched between the heat generating elements 2 and the heat dissipating unit 3, which are connected by the heat conducting adhesive 4 through welding.

Figure 6:
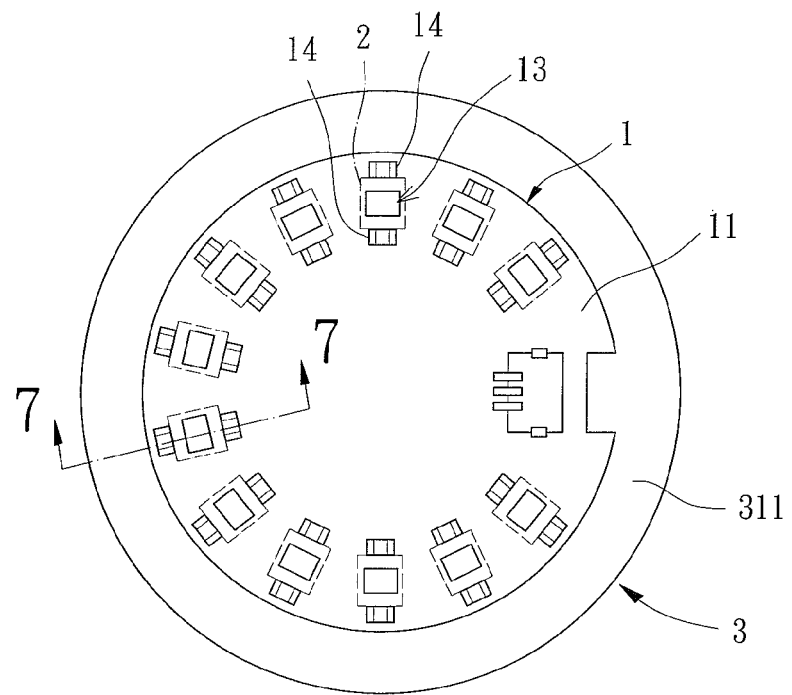
FIG. 6 shows a top view of the heat dissipating assembly of FIG. 5.
Figure 7:
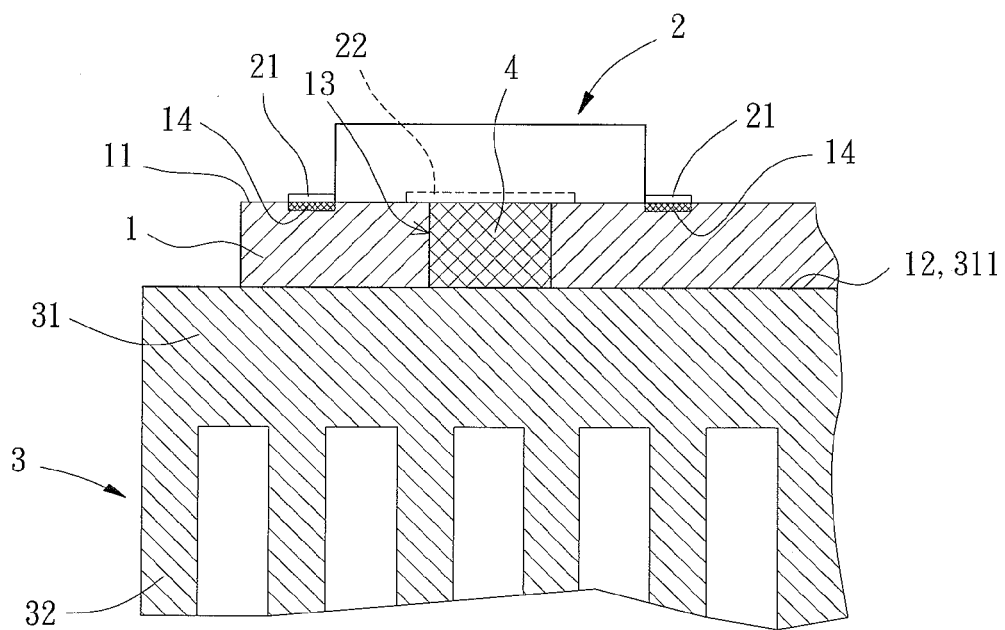
FIG. 7 shows a partial, cross sectional view of the heat dissipating assembly of FIG. 4 according to section line 7-7 of FIG. 6.

With reference to FIGS. 4 and 6, the circuit board 1 is a printed circuit board (PCB) and preferably an FR-4 or FR-5 board. The circuit board 1 includes opposite first and second faces 11 and 12. The circuit board 1 further includes a plurality of through-holes 13 and a plurality of contacts 14. Each through-hole 13 extends from the first face 11 through the second face 12. The through-holes 13 are annularly spaced in this embodiment. The contacts 14 are also annularly spaced and adjacent to the through-holes 13 and embedded in the circuit board 1 to provide electrical connection. In this embodiment, each through-hole 13 is located between two contacts 14.

With reference to FIGS. 4-7, each of the heat generating elements 2 is mounted on the first face 11 of the circuit board 1 and is preferably a light emitting diode (LED) and most preferably a white light LED. Each heat generating element 2 includes two pins 21 and a heat conducting portion 22. The pins 21 are electrically coupled to the contacts 14 of the circuit board 1. In this embodiment, the heat conducting portion 22 of each heat generating element 2 is located at a bottom of the heat generating element 2 and faces one of the through-holes 13. The heat conducting portion 22 of each heat generating element 2 is preferably made of metal material with excellent heat conductivity, such as aluminum, copper, silver, or an alloy thereof. Each heat conducting portion 22 has an area larger than that of each through-hole 13 such that each through-hole 13 can be completely covered by the heat conducting portion 22 of one of the heat generating elements 2. It can be appreciated that the heat generating elements 2 can be any electronic element other than an LED according to the teachings of the present invention.

The heat dissipating unit 3 is preferably a heat sink and made of metal material with excellent heat conductivity, such as aluminum, copper, silver, or an alloy thereof. The heat dissipating unit 3 includes a base 31 and a plurality of fins 32. The base 31 has an engaging face 311 facing one of the first and second faces 11 and 12 of the circuit board 1. In this embodiment, the engaging face 311 is in contact with the second face 12 of the circuit board 1 and faces the through-holes 13. The fins 32 are located on the other face of the base 31 opposite to the engaging face 311. An air channel is formed between two fins 32 adjacent to each other. Thus, air can flow through the air channels and come in contact with the fins 32 to proceed with heat exchange, lowering the temperature of the fins 32.

The heat conducting adhesive 4 is filled in the through-holes 13. The heat conducting adhesive 4 is preferably of the type having excellent heat conductivity and excellent coupling properties, such as heat-conducting silica gel or metal solder (solder pastes). The heat conducting adhesive 4 as the metal solder is heated by surface mount technology (SMT), such as reflow welding, and is melted in each through-hole 13 such that the heat conducting adhesive 4, after hardening, can be reliably engaged with the engaging face 311 of the base 31 and the heat conducting portion 22 of one of the heat generating elements 2. In the other case, the heat conducting adhesive 4 as the heat-conducting silica gel may be heated up by high-temperature baking and solidifying process. Thus, the circuit board 1 is securely sandwiched between the heat generating elements 2 and the heat dissipating unit 3.

With reference to FIGS. 4-7, during operation of the heat generating elements 2, the temperature of the heat generating elements 2 is increased by the heat generated by themselves. The heat is directly transmitted through the heat conducting adhesive 4 to the base 31 of the heat dissipating unit 3. The heat exchange rate is increased by the fins 32 that increase the heat exchange area. Thus, the heat generating elements 2 can work at an appropriate working temperature, as the temperature of heat generating elements 2 is lowered. The performance of the heat generating elements 2 is enhanced, and the service life of the heat generating elements 2 is prolonged.

By providing the circuit board 1 with the through-holes 13 receiving the heat conducting adhesive 4 that directly interconnects the heat generating elements 2 and the heat dissipating unit 3, the heat generated by the heat generating elements 2 can be directly transmitted through the heat conducting adhesive 4 to the heat dissipating unit 3. Furthermore, since the heat generating portions 22, the heat conducting adhesive 4 and the heat dissipating unit 3 are made of material with excellent heat conductivity, additional members and/or heat spreader plates are not required. The overall heat dissipating efficiency can be effectively enhanced while reducing the number of members. The manufacturing costs are thus cut.

Furthermore, the heat-conducting silica gel is preferably chosen as the heat conducting adhesive 4 in the various embodiments for illustration purposes. Since the heat generating elements 2 are directly fixed to the heat dissipating unit 3 by the heat conducting adhesive 4, a single high-temperature baking and solidifying process is sufficient to complete the assemblage of the circuit board 1, the heat generating elements 2, and the heat dissipating unit 3 while securely sandwiching the circuit board 1 between the heat generating elements 2 and the heat dissipating unit 3. Namely, the assemblage of the heat dissipating assembly according to the teachings of the present invention can be accomplished without the need for more processes that are conventionally required to fix the circuit board 1 and the heat generating elements 2 together and to fix the circuit board 1 and the heat dissipating unit 3 together. Further, the heat generating elements 2 and the heat dissipating unit 3 are respectively in contact with the first and second faces 11 and 12 of the circuit board 1, maintaining reliable assembly. Thus, the assembling process is effectively simplified according to the teachings of the present invention, further enhancing the assembling efficiency.

Figure 8:
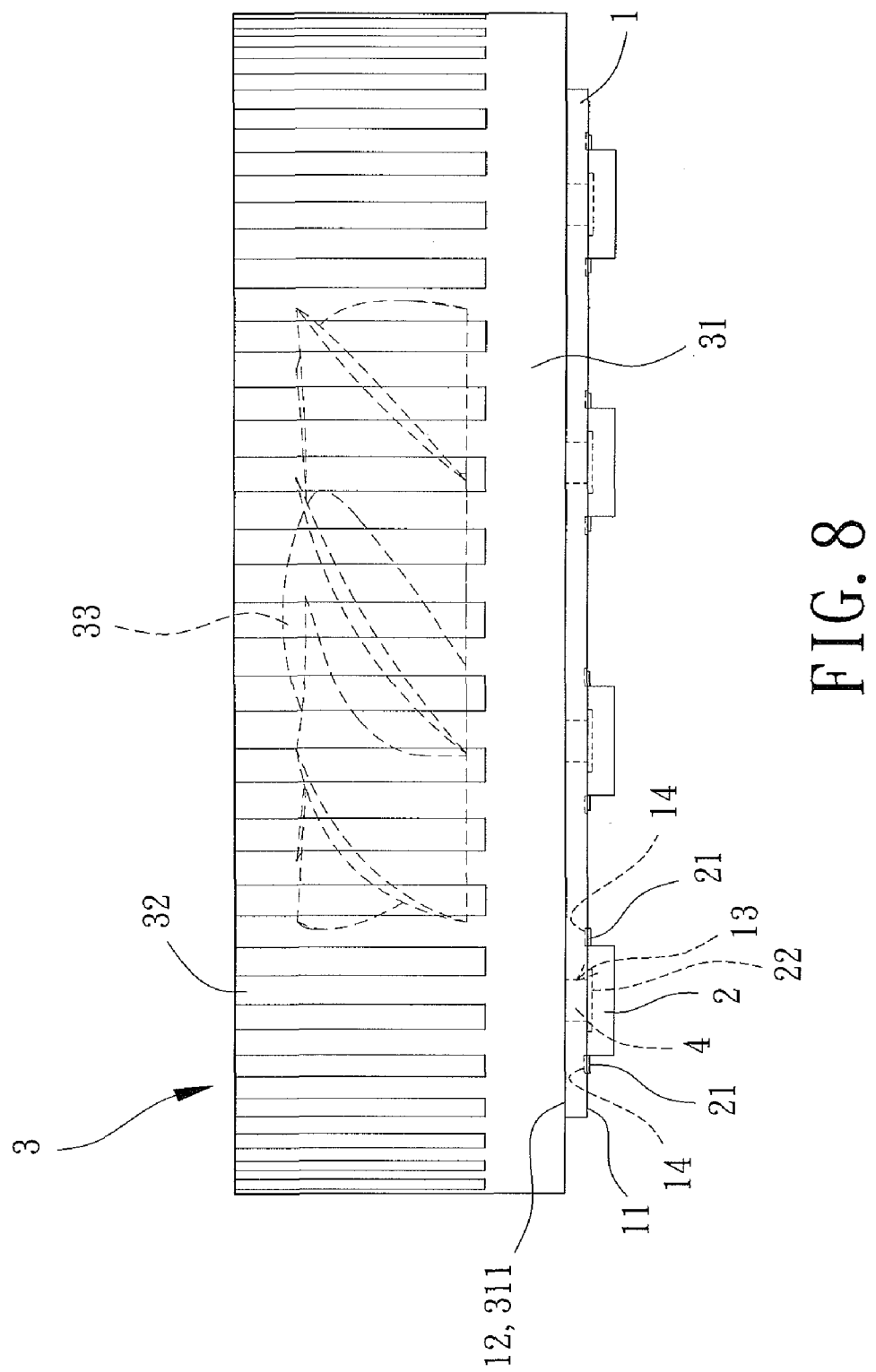
FIG. 8 shows a side view of a heat dissipating assembly of a second embodiment according to the preferred teachings of the present invention.

FIG. 8 shows a heat dissipating assembly of a second embodiment according to the teachings of the present invention. Compared to the first embodiment, the heat dissipating unit 3 further includes a fan 33 of the axial flow or blower type. The fan 33 is rotatably mounted in a recessed portion formed by the fins 32. The fan 33 is rotatable to create air currents flowing away from or towards the base 31 or the fins 32 of the heat dissipating unit 3, providing active air circulation and further enhancing the heat dissipating efficiency provided to the circuit board 1 and the heat generating elements 2 for the purposes of lowering the temperature.

Figure 9:
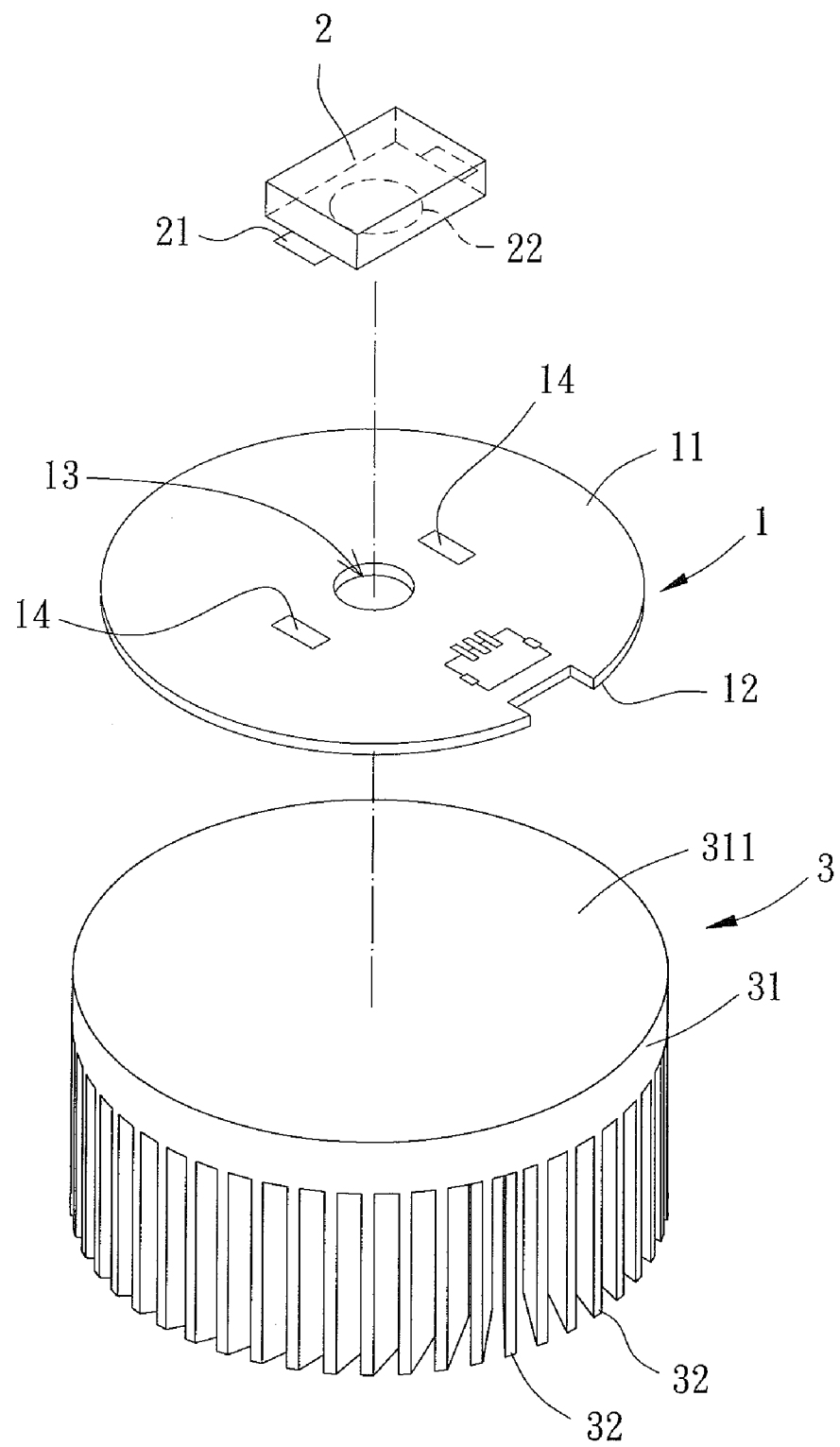
FIG. 9 shows an exploded, perspective view of a heat dissipating assembly of a third embodiment according to the preferred teachings of the present invention.
Figure 10:
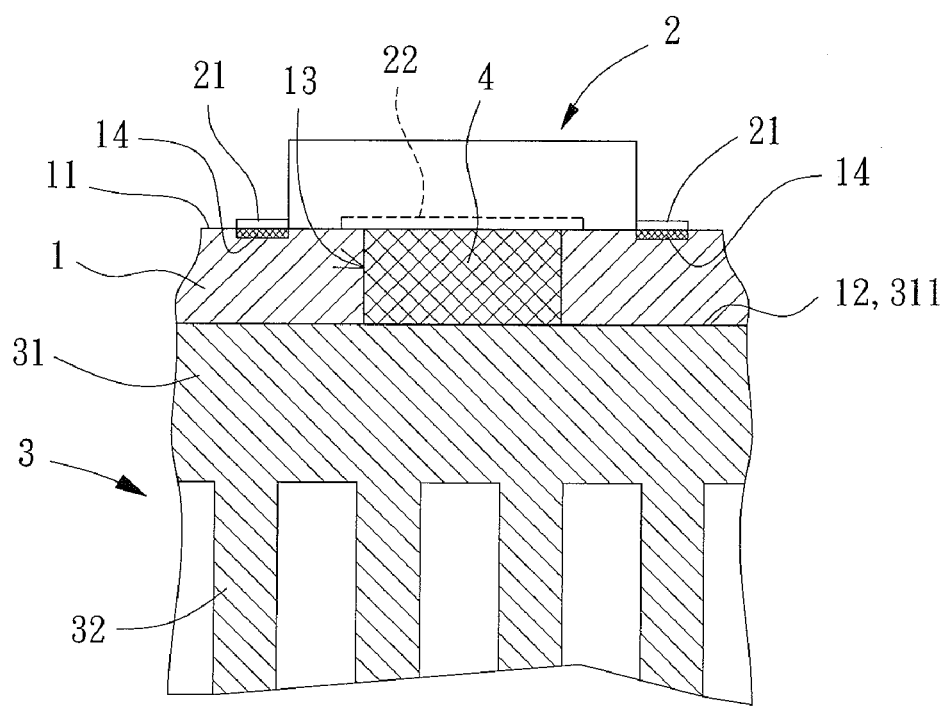
FIG. 10 shows a partial, enlarged, cross sectional view of the heat dissipating assembly of FIG. 9.

FIGS. 9 and 10 show a heat dissipating assembly of a third embodiment according to the teachings of the present invention. Compared to the first embodiment, the circuit board 1 of the third embodiment includes only one through-hole 13, and two contacts 14 are placed adjacent to the through-hole 13. In the illustrated embodiment, the through-hole 13 is located in a center of the circuit board 1 and between the two contacts 14. The heat dissipating assembly includes only one heat generating element 2 whose heat conducting portion 22 has a shape corresponding to the through-hole 13. Specifically, the through-hole 13 is completely covered by the heat conducting portion 22 when the heat generating element 2 is mounted to the first face 11 of the circuit board 1. It can be appreciated that the fan 33 shown in the second embodiment can be utilized in the third embodiment.

The heat dissipating assembly according to the teachings of the present invention can easily be assembled regardless of the number of the electronic members and thus can widely be utilized in various electronic devices.

Figure 11:
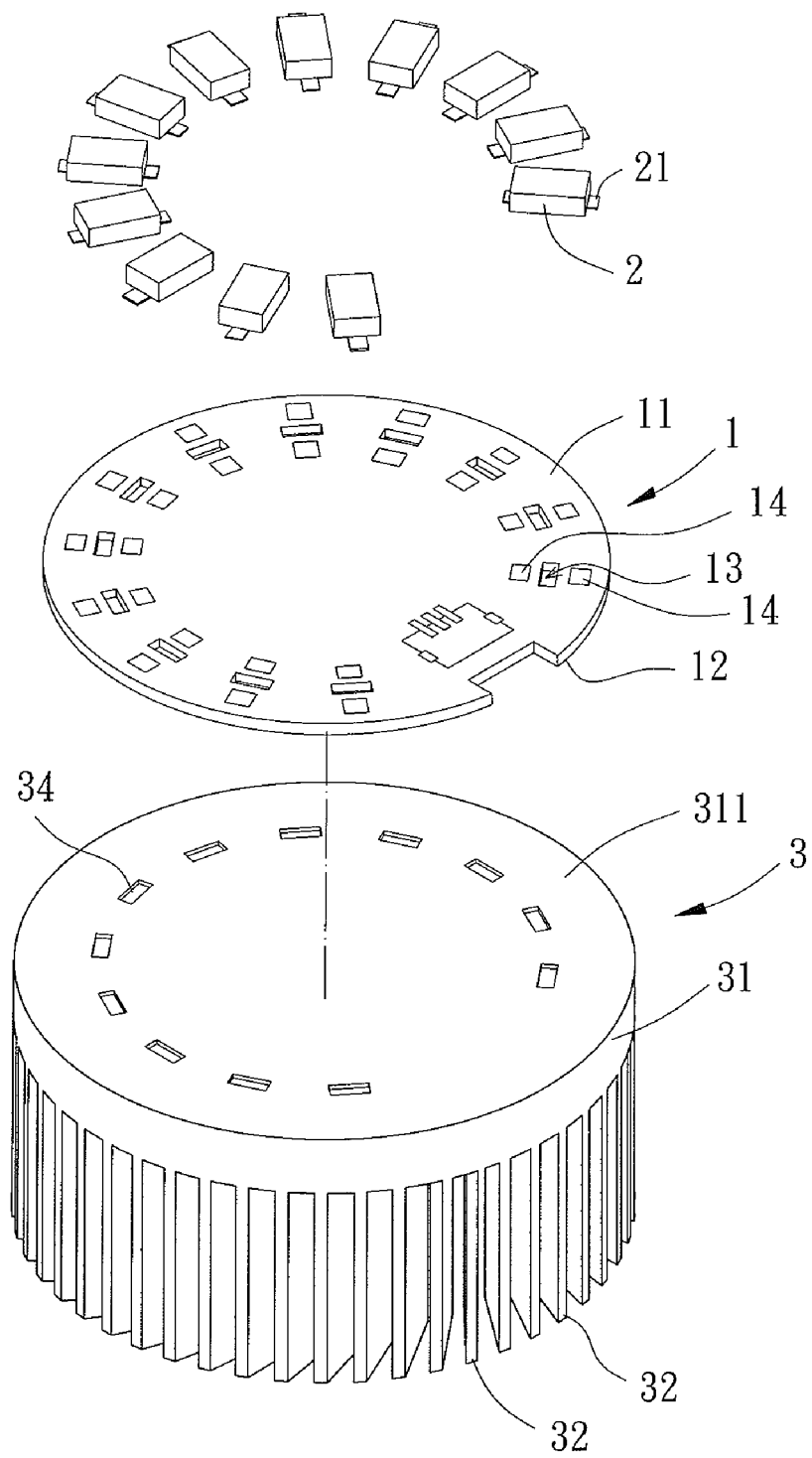
FIG. 11 shows an exploded, perspective view of a heat dissipating assembly of a fourth embodiment according to the preferred teachings of the present invention.
Figure 12:
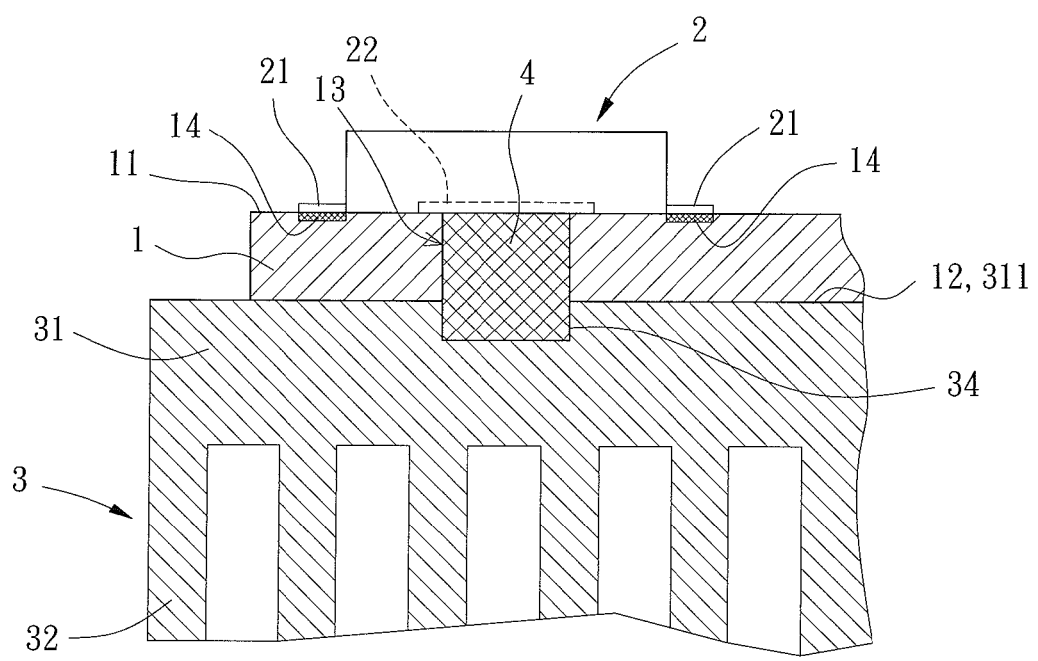
FIG. 12 shows a partial, enlarged, cross sectional view of the heat dissipating assembly of FIG. 11.

FIGS. 11 and 12 show a heat dissipating assembly of a fourth embodiment according to the teachings of the present invention. Compared to the first embodiment, the heat dissipating unit 3 further includes a plurality of coupling portions 34 (or only one coupling portion 34, depending on requirement) formed on the engaging face 311 of the base 31. The coupling portions 34 are arranged in the same way as the through-holes 13, with each coupling portion 34 corresponding to one through-hole 13. Thus, the through-holes 13 are aligned with and link to the coupling portions 34 when the circuit board 1 abuts with the engaging face 311 of the base 31. The coupling portions 34 in the embodiment are implemented as blind holes, but are not limited thereto. Based on this, when the heat conducting adhesive 4 is filled in the through-holes 13 and is baked and solidified with high temperature, the coupling portions 34 may be filled with the heat conducting adhesive 4.

In the fourth embodiment, the coupling between the base 31 and the heat conducting adhesive 4 may be reinforced by using the coupling portions 34 to increase the coupling area between the base 31 and the heat conducting adhesive 4.

Figure 13:
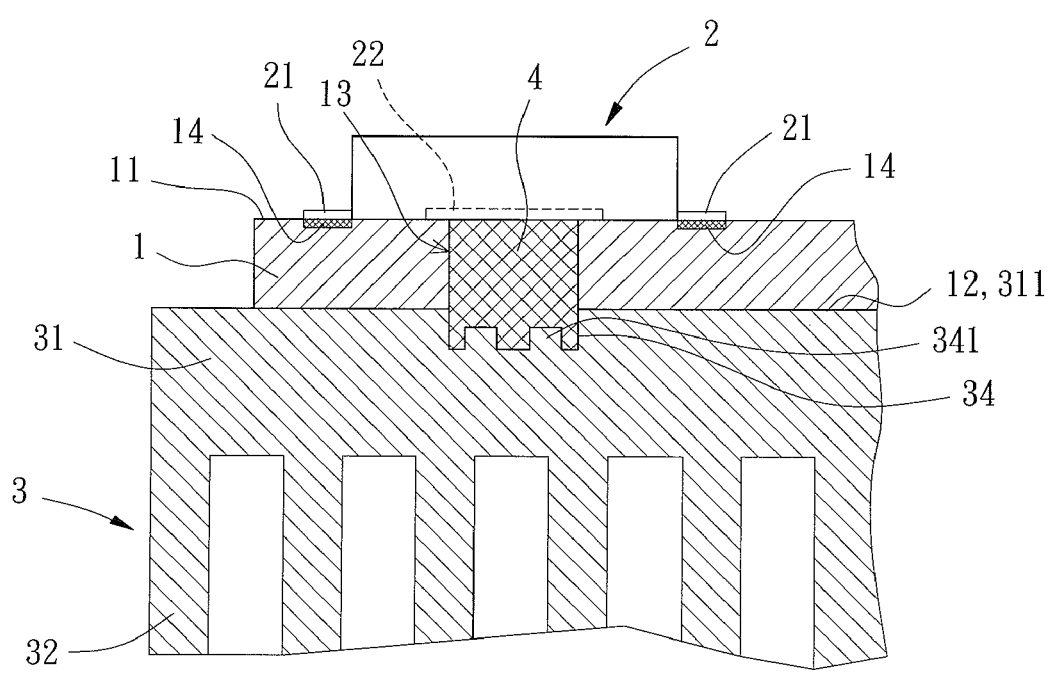
FIG. 13 shows a partial, enlarged, cross sectional view of the heat dissipating assembly of a fifth embodiment according to the preferred teachings of the present invention.

FIG. 13 shows a heat dissipating assembly of a fifth embodiment according to the teachings of the present invention. Compared to the first embodiment, the coupling portion 34 includes a plurality of protrusions 341 on an inner wall thereof. In the embodiment, the protrusions 341 are formed on a bottom of the coupling portion 34. Through the protrusions 341, the coupling area between the heat conducting adhesive 4 and the inner wall of the coupling portion 34 may be increased. Thus, coupling between the heat conducting adhesive 4 and the inner wall of the coupling portion 34 is increased.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A heat dissipating assembly comprising:
a circuit board including opposite first and second faces, with the circuit board further including a plurality of through-holes extending from the first face through the second face, and a plurality of contacts;
a plurality of heat generating elements each having a bottom mounted on the first face of the circuit board, with the plurality of heat generating elements electrically coupled to the plurality of contacts, with each of the plurality of heat generating elements including a heat conducting portion located at the bottom and aligned with only one of the plurality of through-holes, with the heat conducting portion of each of the plurality of heat generating elements having a first area, with each of the plurality of through-holes having a second area smaller than the first area and covered by the heat conducting portion of one of the plurality of heat generating elements
a heat dissipating unit including a base having an engaging face in contact with the second face of the circuit board and facing the said through-holes; and
a heat conducting silica gel filled in each of the plurality of through-holes, with the heat conducting silica gel engaged with the engaging face of the base and the heat conducting portion of one of the plurality of heat generating elements, with the only one of the plurality of through-holes being completely covered by the heat conducting portion of the one of the plurality of heat generating elements.

2. The heat dissipating assembly as claimed in claim 1, with each of the plurality of contacts of the circuit board located adjacent to one of the plurality of through-holes.

3. The heat dissipating assembly as claimed in claim 2, with each two of the plurality of contacts located adjacent to one of the said through-holes while the through-hole is located between the two contacts.

4. The heat dissipating assembly as claimed in claim 1, with the heat dissipating unit further including a plurality of fins formed on another face of the base opposite to the engaging face, with an air channel formed between two of the plurality of fins adjacent to each other.

5. The heat dissipating assembly as claimed in claim 1, with the heat dissipating unit further including a plurality of coupling portions formed on the engaging face of the base, with the plurality of coupling portions aligning with and linking to the plurality of through-holes.

6. The heat dissipating assembly as claimed in claim 5, with each of the plurality of coupling portions being a blind hole, with the heat conducting silica gel also filled in each blind hole below the base.

7. The heat dissipating assembly as claimed in claim 6, with each blind hole including a plurality of protrusions on an inner wall thereof, with the heating conducting silica gel surrounding the plurality of protrusions.

8. The heat dissipating assembly as claimed in claim 4, with the heat dissipating unit further including a fan rotatably mounted to a side of one of the bases and the plurality of fins, with the fan rotatable to create air currents flowing away from or towards the base or the plurality of fins.

9. The heat dissipating assembly as claimed in claim 1, with the heat conducting portion of each of the plurality of heat generating elements made of aluminum, copper, silver, or an alloy thereof.

10. The heat dissipating assembly as claimed in claim 1, with the plurality of heat generating elements being light emitting diodes.

11. The heat dissipating assembly as claimed in claim, with the heat dissipating unit made of aluminum, copper, silver, or an alloy thereof.

12. A heat dissipating assembly comprising:
a circuit board including opposite first and second faces, with the circuit board further including a through-hole extending from the first face through the second face;
a heat generating element having a bottom mounted on the first face of the circuit board and electrically coupled to the circuit board, with the heat generating element including a heat conducting portion located at the bottom and aligned with the through-hole, with the heat conducting portion of the heat generating element having a first area, with the through-hole having a second area smaller than the first area and completely covered by the heat conducting portion of the heat generating element;
a heat dissipating unit including a base having an engaging face in contact with the second face of the circuit board and facing the said through-hole; and
a heat conducting silica gel filled in the through-hole, with the heat conducting silica gel engaged with the engaging face of the base and the heat conducting portion of the heat generating element.

13. The heat dissipating assembly as claimed in claim 12, with the circuit board further including two contacts adjacent to the through-hole, with the heat generating element electrically coupled to the circuit board by the two contacts.

14. The heat dissipating assembly as claimed in claim 13, with the through-hole located between the two contacts.

15. The heat dissipating assembly as claimed in claim 12, with the heat dissipating unit further including a plurality of fins formed on another face of the base opposite to the engaging face, with an air channel formed between two of the plurality of fins adjacent to each other.

16. The heat dissipating assembly as claimed in claim 12, with the heat dissipating unit further including at least one coupling portion formed on the engaging face of the base, with the at least one coupling portion aligning with and linking to the through-hole.

17. The heat dissipating assembly as claimed in claim 16, with the at least one coupling portion being a blind hole, with the heat conducting silica gel also filled in the blind hole.

18. The heat dissipating assembly as claimed in claim 17, with the blind hole including a plurality of protrusions on an inner wall thereof, with the heat conducting silica gel surrounding the plurality of protrusions.

19. The heat dissipating assembly as claimed in claim 15, with the heat dissipating unit further including a fan rotatably mounted to a side of one of the bases and the plurality of fins, with the fan rotatable to create air currents flowing away from or towards the base or the plurality of fins.

20. The heat dissipating assembly as claimed in claim 12, with the through-hole located in a center of the circuit board, with the through-hole having a shape corresponding to a shape of the heat conducting portion of the heat generating element, with the shape of the heat conducting portion being concentric to the shape of the through-hole.

21. A heat dissipating assembly comprising:
a circuit board including opposite first and second faces, with the circuit board further including a through-hole extending from the first face through the second face;
a heat generating element having a bottom mounted on the first face of the circuit board and electrically coupled to the circuit board, with the heat generating element including a heat conducting portion located at the bottom and aligned with the through-hole, with the heat conducting portion of the heat generating element having a first area, with the through-hole having a second area smaller than the first area and completely covered by the heat conducting portion of the heat generating element;
a heat dissipating unit including a base having an engaging face in contact with the second face of the circuit board and facing the said through-hole; and
a metal solder filled in the through-hole, with the metal solder engaged with the engaging face of the base and the heat conducting portion of the heat generating element.

22. The heat dissipating assembly as claimed in claim 21, with the metal solder being a solder paste.

23. The heat dissipating assembly as claimed in claim 22, with the heat dissipating unit further including at least one coupling portion formed on the engaging face of the base, with the at least one coupling portion aligning with and linking to the through-hole.

24. The heat dissipating assembly as claimed in claim 20, with the at least one coupling portion being a blind hole, with the heat conducting silica gel also filled in the blind hole.

25. The heat dissipating assembly as claimed in claim 24, with the blind hole including a plurality of protrusions on an inner wall thereof, with the heat conducting silica gel surrounding the plurality of protrusions.

26. The heat dissipating assembly as claimed in claim 22, with the through-hole located in a center of the circuit board, with the through-hole having a shape corresponding to a shape of the heat conducting portion of the heat generating element, with the shape of the heat conducting portion being concentric to the shape of the through-hole.

* * * * *